(12) United States Patent
Kanetani et al.

(10) Patent No.: US 6,337,581 B1
(45) Date of Patent: Jan. 8, 2002

(54) SIGNAL TRANSMISSION CIRCUIT AND SEMICONDUCTOR MEMORY USING THE SAME

(75) Inventors: Kazuo Kanetani, Akishima; Hiroaki Nambu, Sagamihara; Kaname Yamasaki, Kokubunji; Takeshi Kusunoki, Tachikawa; Fumihiko Arakawa, Tokorozawa, all of (JP)

(73) Assignees: Hitachi, Ltd., Tokyo; Hitachi Engineering Co., Ltd., Mobara, both of (JP)

( * ) Notice: Subject to any disclaimer, the term of this patent is extended or adjusted under 35 U.S.C. 154(b) by 0 days.

(21) Appl. No.: 09/599,738

(22) Filed: Jun. 23, 2000

(30) Foreign Application Priority Data

Jun. 23, 1999 (JP) .......................................... 11-176286

(51) Int. Cl.$^7$ ......................................... H03K 19/0185
(52) U.S. Cl. ............................. 326/83; 326/86; 326/30; 326/98; 326/93
(58) Field of Search .............................. 326/21, 30, 83, 326/86, 93, 95, 98

(56) References Cited

U.S. PATENT DOCUMENTS

| 5,291,876 A | 3/1994 | Bridges et al. | |
| 5,373,203 A | 12/1994 | Nicholes et al. | |
| 5,859,548 A | * 1/1999 | Kong | ........................ 326/113 |
| 6,043,674 A | * 3/2000 | Sobelman | ..................... 326/35 |
| 6,043,696 A | * 3/2000 | Klass et al. | .................. 327/211 |
| 6,104,209 A | * 8/2000 | Keeth et al. | .................... 326/83 |
| 6,108,805 A | * 8/2000 | Rajsuman | ................... 714/724 |

FOREIGN PATENT DOCUMENTS

JP          10150358          of 1998

* cited by examiner

*Primary Examiner*—Michael Tokar
*Assistant Examiner*—Vibol Tan
(74) *Attorney, Agent, or Firm*—Antonelli, Terry, Stout & Kraus, LLP

(57) ABSTRACT

Disclosed herein is a transmission circuit for transmitting a data signal between circuit units on a semiconductor integrated circuit through a signal wire. The data signal is transmitted by a driver circuit for precharging the signal wire to a high potential during a precharge period and discharging the signal wire to a low potential according to data to be transmitted during an evaluation period or keeping the signal wire at a high potential as floating as it is. Latch type Source-Coupled-Logic configured so that a first node and a second node used as an output terminal to the next stage are respectively charged together to a high potential during the precharge period, the second node is discharged according to a potential at the first node during the evaluation period, and the first node is discharged according to a potential on the signal wire, is used as a receiving circuit, whereby a distinction as to a high or low level of the potential on the signal wire is made with early timing provided to perform the operation of discharging the signal wire by the driver circuit.

28 Claims, 15 Drawing Sheets

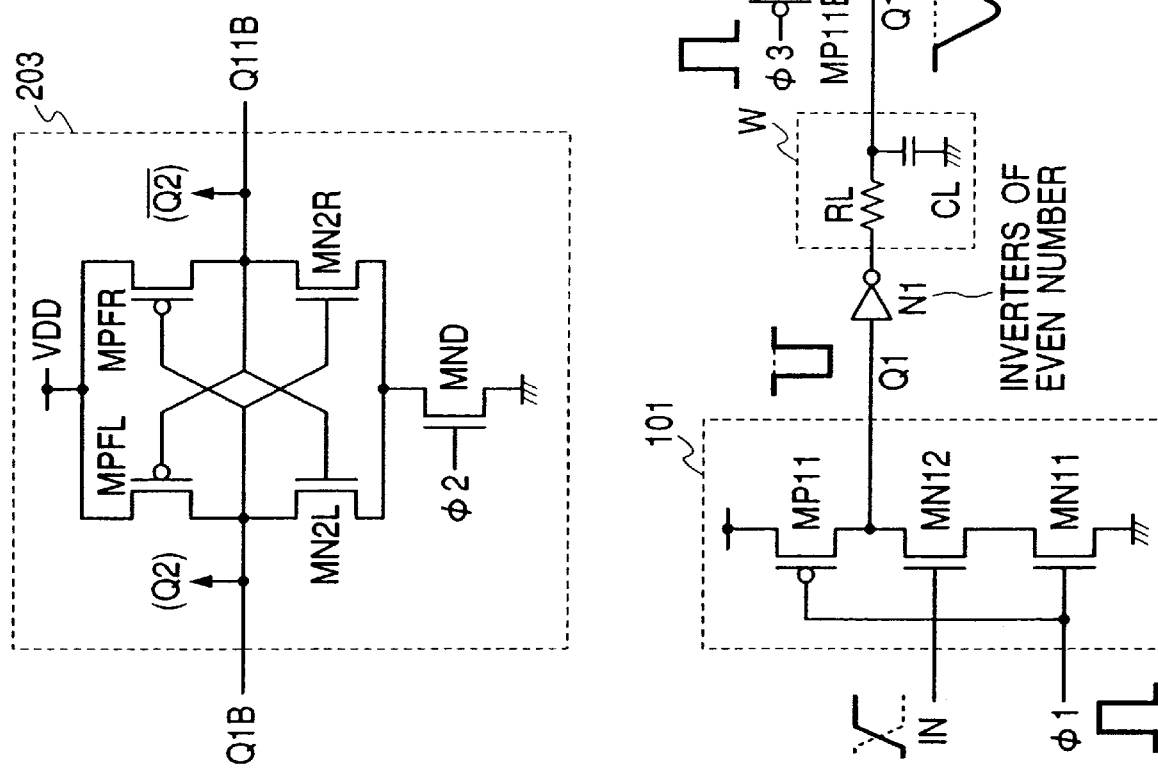

US 6,337,581 B1

SIGNAL TRANSMISSION CIRCUIT AND SEMICONDUCTOR MEMORY USING THE SAME

FIELD OF THE INVENTION

The present invention relates to a transmission circuit for transmitting signals between circuit units on a semiconductor integrated circuit, and a semiconductor memory using the same.

BACKGROUND OF THE INVENTION

A transmission circuit capable of transmitting signals at high speed even through a wire long in length and large in parasitic capacitance has been desired for a semiconductor integrated circuit. In the case of a CMOS circuit, a circuit shown in FIG. 18 is known as a conventional transmission circuit. In the same drawing, reference numeral 101 indicates a dynamic CMOS circuit used as a driver circuit. Symbol W indicates an equivalent circuit of a wire in which a parasitic capacitance CL and a parasitic resistance RL are taken into consideration. Reference numeral 200 indicates an inverter used as a receiving circuit. Symbol φ1 indicates a control signal and Symbol IN indicates a data signal respectively. Operational waveforms of the circuit are illustrated in FIG. 19. When the control signal φ1 is a low potential VSS ('L'), a precharge period is set up, whereas when the control signal φ1 is a high potential VDD ('H'), an evaluation period is setup. During the precharge period, an output Q1 produced from the driver circuit 101 reaches 'H'. If the data signal IN is 'H' (indicated by a solid line) when the control signal φ1 changes from 'L' to 'H', then the output Q1 is discharged and changed from 'H' to 'L'. Under the influence of a time interval (CR time constant) obtained from the product of the parasitic capacitance CL and the parasitic resistance RL of the wire W, an output Q1B at the exit of the wire W changes from 'H' to 'L'. Thereafter, the receiving circuit 201 outputs an output Q2 in response to the output Q1B at the exit of the wire W. On the other hand, if the data signal IN is 'L' (indicated by a broken line) when the control signal φ1 changes from 'L' to 'H', then no outputs Q1 and Q1B are discharged and they are maintained at 'H'. As the parasitic capacitance of the output part Q1 increases, transistors large in gate width are used as transistors for the driver circuit 101, and the shortening of the time required to charge and discharge the output Q1 is achieved.

SUMMARY OF THE INVENTION

In the conventional transmission circuit as indicated by the operational waveforms shown in FIG. 19, the time necessary for the output Q1 of the driver circuit 101 to fall is faster and a delay time (tpd1) thereof is small. However, the waveform is rendered dull due to the influence of the parasitic capacitance and the parasitic resistance at the exit Q1B of the wire W, and a delay time (tcrf) is developed (where the logic threshold potential of the inverter constituting the receiving circuit is supposed to be a common (VDD/2)). The delay time developed due to the influence of the wire increases in proportion to the product of the parasitic capacitance and the parasitic resistance. Therefore, the delay time is so long and becomes dominant when the wire is long, and hence the performance of the semiconductor integrated circuit is rate-controlled by the delay time developed under the influence of the wire.

Incidentally, a waveform-dull phenomenon is not limited only to the case where the length of the wire is long. There may be cases in which transistors each having a small gate width, which are short in wiring length and large in parasitic capacity, are used for the driver circuit 101.

With the foregoing problems in view, it is therefore an object of the present invention to shorten the time required to transmit a data signal even when a signal waveform is made dull.

Another object of the present invention is to shorten a precharge time at an exit portion of a signal wire (transmission line) and shorten a transmission cycle time.

According to one aspect of the present invention, for achieving the above objects, there is provided a transmission circuit, comprising a driver circuit alternately controlled to a precharge period and an evaluation period according to a first control signal, the driver circuit precharging an output node to a first source potential during the precharge period and driving the output node to either one of the first source potential and a second source potential according to a potential at an input node during the evaluation period, a signal line coupled to the output node of the driver circuit so as to be driven by the driver circuit, and a receiving circuit comprising a semiconductor logic circuit, which has a first node and a second node and is alternately controlled to the precharge period and the evaluation period according to a second control signal to precharge the first and second nodes to the first source potential together during the precharge period, and discharge the second node according to a potential at the first node and discharge the first node according to a potential on the signal line during the evaluation period, thereby making a distinction as to the potential on the signal line with the potential at the first node as a reference potential. Further a signal line precharge transistor is provided at an exit portion of the signal line (transmission line).

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 10 is a circuit diagram showing a modification illustrative of the receiving circuit and a driver circuit both employed in the above-described embodiment;

FIG. 11 is a circuit diagram illustrating a third embodiment;

DETAILED DESCRIPTION OF THE PREFERRED EMBODIMENTS

Preferred embodiments of the present invention will hereinafter be described in detail with reference to the accompanying drawings.

Figure 1:
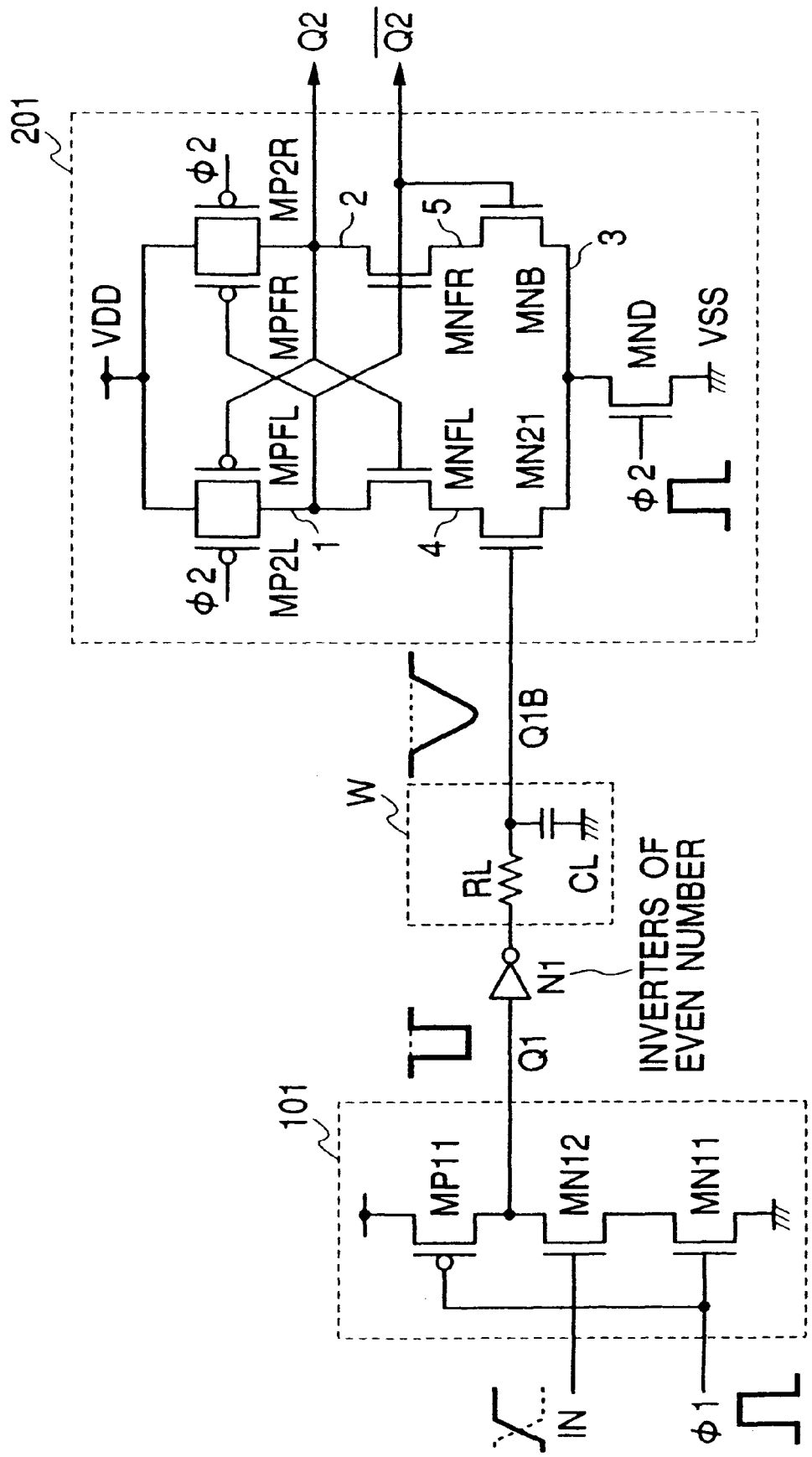
FIG. 1 is a circuit diagram showing a first embodiment.
Figure 18:
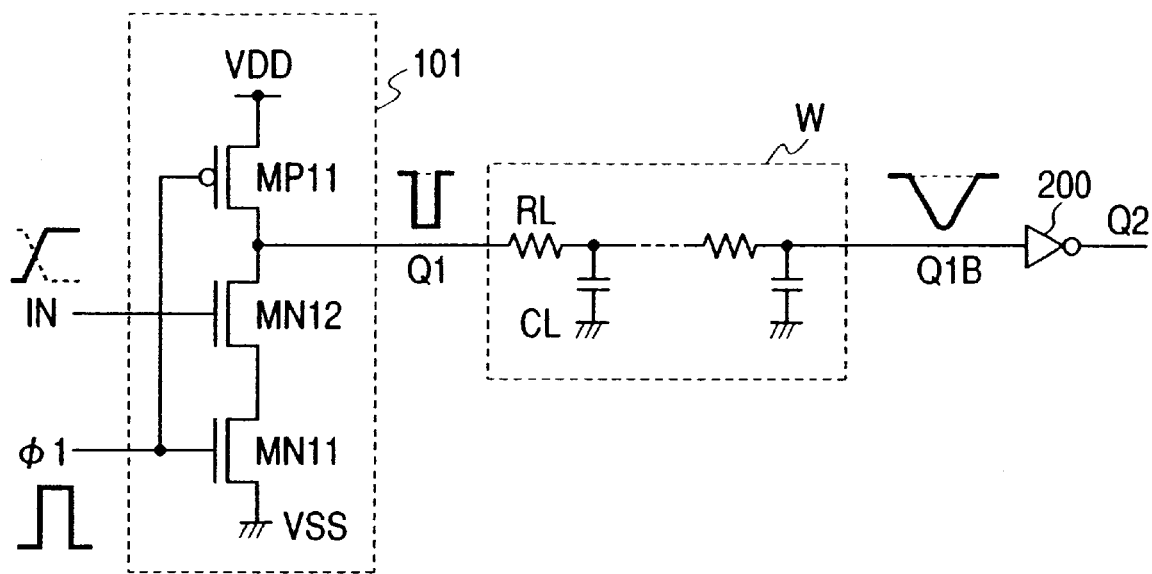
FIG. 18 is a circuit diagram depicting a prior art.
Figure 19:
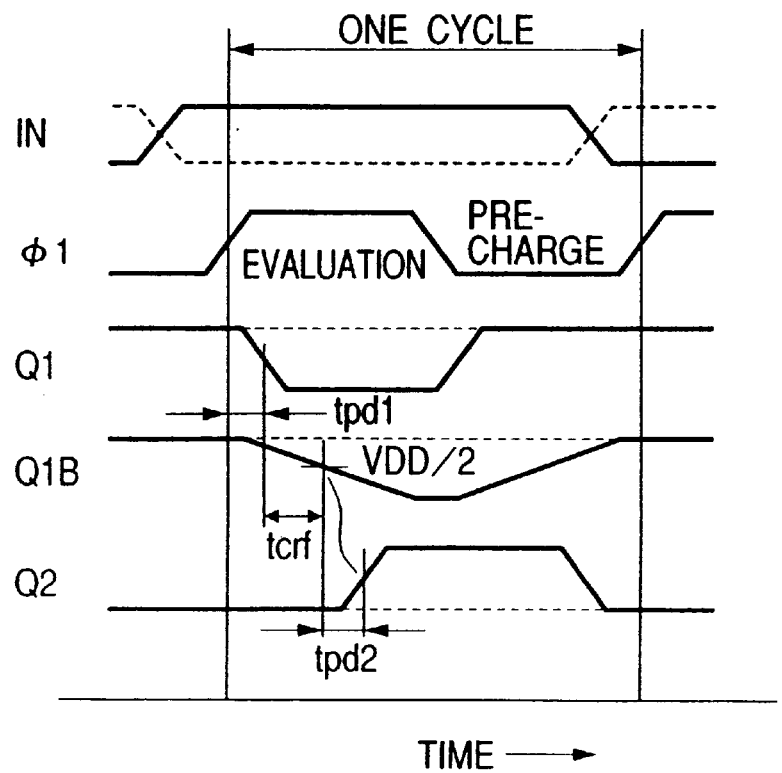
FIG. 19 is a waveform diagram showing the operation of the prior art.

FIG. 1 shows a first embodiment of the present invention. A driver circuit 101 is similar to the driver circuit employed in the prior art shown in FIG. 18. The driver circuit 101 is alternately controlled to a precharge period and an evaluation period based on a control signal $\phi1$. When the control signal $\phi1$ falls within a high potential period (precharge period), an MP11 is turned on and an MN11 is turned off so that a signal wire W to be driven is precharged to a high potential through the MP11. When the control signal $\phi1$ is placed during a low potential period (evaluation period), the MP11 is turned off and the MN11 is turned on. Therefore, the state of an output Q1 connected to the signal wire W depends on the state of an input transistor MN12. Namely, if a data signal IN to be transmitted is in a high potential ('H'), then discharge is started to bring the output Q1 to a low potential ('L'). If the data signal IN is 'L', then the output Q1 remains at 'H' under floating. Such a driver circuit 101 drives the signal wire W and transmits data to a receiving circuit 201. Incidentally, there may be cases where inverters of even number are interposed in the course of the signal wire W as designated at numeral N1 in FIG. 1.

The receiving circuit 201 is a dynamic type logic circuit for, in response to one input signal, obtaining true and its complementary outputs approximately equal to each other. This will be referred to as source-coupled logic (SCL circuit) below. Details of the SCL circuit have been described in JP-A No. H10-150358, U.S. Pat. Nos. 5,291,076 and 5,373, 203. Of these, a circuit (latch type SCL circuit) having a latch function is used as the receiving circuit 201 shown in FIG. 1. In the receiving circuit 201, a precharge transistor MP2L is electrically connected between a high potential source VDD and a first node 1, a precharge transistor MP2R is electrically connected between the high potential source VDD and a second node 2, and a control signal $\phi2$ is connected to the gates of the MP2L and MP2R. The first node 1 is electrically connected to the drain of an input transistor NM21 through a feedback transistor MNFL, whereas the second node 2 is electrically connected to the drain of a reference transistor MNB through a feedback transistor MNFR. The sources of the input transistor MN21 and the reference transistor MNB are connected in common, and an activation transistor MND controlled based on the control signal $\phi2$ is electrically connected between a common connecting point (third node) 3 thereof and a low potential source VSS. The signal wire W is electrically connected to the gate of the input transistor MN21. On the other hand, the gate of the reference transistor MNB is electrically connected to the first node 1. The gates of the MNFL and MNFR are respectively electrically connected to the second node 2 and the first node 1 in cross form. Further, the gates of a level compensating transistor MPFL parallel-connected to the MP2L and a level compensating transistor MPFR parallel-connected to the MP2R are also respectively electrically connected to the second node 2 and the first node 1 in cross form.

When the control signal $\phi2$ is low in potential (in a precharged state), the precharge transistors MP2L and MP2R are brought into conduction so that the complementary output nodes (Q2 and $\overline{Q2}$) and the gate of the reference transistor MNB are respectively charged to the high potential VDD. Next, if an input Q1B is low in potential when the control signal $\phi2$ changes from the low potential to the high potential (evaluation state), then the conduction of the MNB rather than that of the transistor MN21 is strong. Thus, the output node Q2 is discharged to a low potential and the node $\overline{Q2}$ remains at a high potential. On the other hand, if the input Q1B is high in potential, then the conduction of the transistor MN21 and that of the transistor MNB are equal to each other in strength, and the output nodes Q2 and $\overline{Q2}$ both begin to drop in potential. However, when the output node $\overline{Q2}$ starts to drop in potential, the conduction of the MN21 becomes stronger than that of the transistor MNB. Thus, the output node $\overline{Q2}$ is discharged to the low potential and the output node Q2 is reset to the high potential by the level compensating transistor MPFR. Namely, the present SCL circuit is capable of discriminating whether one input signal is high or low in potential, in response to one input signal and outputting complementary signals approximately equal in delay time to each other.

Figure 2A:
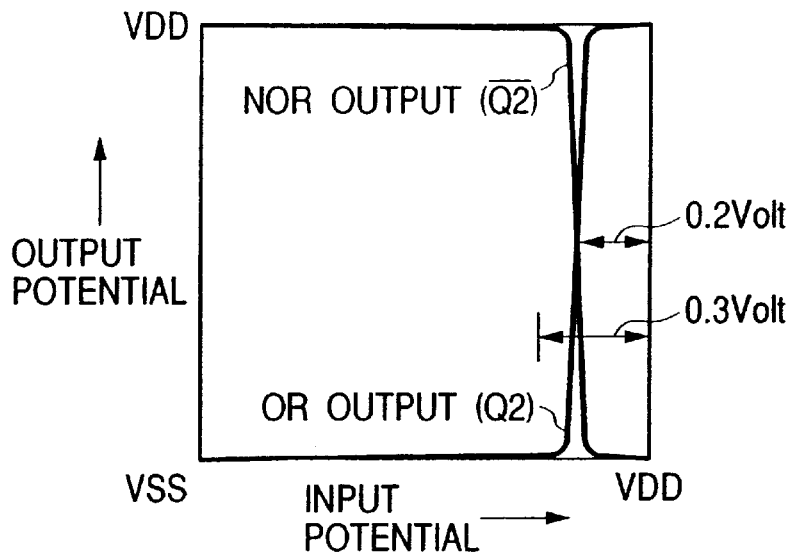
FIGS. 2A and 2B are respectively a characteristic diagram and a waveform diagram illustrating effects obtained in the first embodiment.

An input/output characteristic of the latch type SCL circuit is shown in FIG. 2A. It is understood from the drawing that a logic threshold potential is a potential lowered by about 0.2V as viewed from the high potential VDD. Accordingly, the OR output Q2 is given in the following manner, for example. If the input potential is of the high potential VDD, then the output potential results in the high potential VDD. If the input potential is a potential lowered by about 0.3V or higher as seen from the high potential VDD, then the output potential becomes the low potential VSS. The NOR output $\overline{Q2}$ works in reverse. Thus, the reason why the logic threshold potential lies on the high potential VDD side, is that since the receiving circuit 201 has the latch function, the degree of amplification is large and the potential at the gate of the reference transistor MNB is kept at the high potential VDD in its initial stage.

Figure 2B:
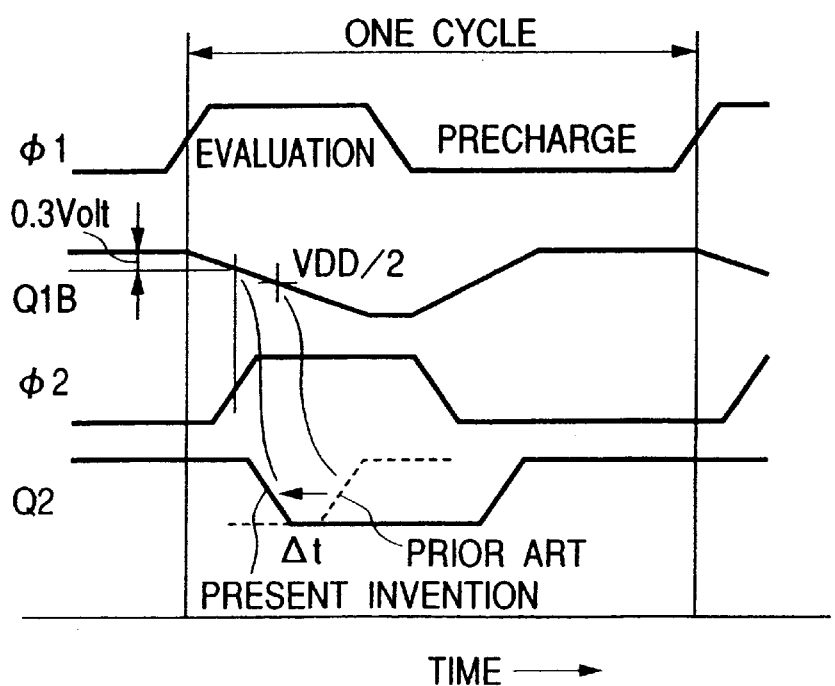

The operation of the first embodiment will next be described using FIG. 1 and FIG. 2B. FIG. 2B is an operation waveform diagram at the time that the data signal IN is high in potential. When the control signal $\phi1$ changes from the low potential to the high potential (evaluation state), a waveform becomes dull at the exit Q1B of the wire W due to the influence of parasitic capacitance and resistance as described in the prior art. On the other hand, when the control signal φ2 is low in potential, the receiving circuit 201 is kept in the precharged state and hence the output Q2 of the receiving circuit 201 is maintained at the high potential regardless of the potential on the wire W. Timing provided to lower the potential at the exit Q1B of the wire W by about 0.3V as counted from the high potential will be enough for timing provided to input the control signal φ2 due to the reason mentioned above in FIG. 2A. As a result, the output Q2 changes from the high potential to the low potential in a short time as indicated by a solid line in FIG. 2B. On the other hand, since the operation of inverting the output is not completed in the prior art when the potential at the exit Q1B of the wire W is not lowered from a potential (VDD/2), a large delay time occurs in the output Q2 as indicated by a broken line in FIG. 2B. Therefore, the present embodiment rather than the prior art is speeded up by a difference (Δt) in delay time. Incidentally, it is necessary to taken into consideration the input timing of the control signal φ2 with respect to the input timing of the control signal φ1 in association with a response delay produced by the signal wire W.

Figure 3A:
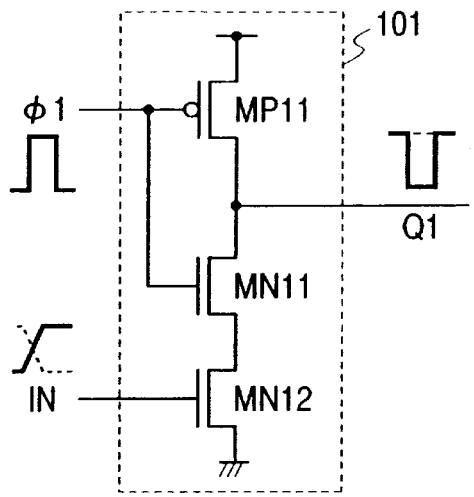
FIGS. 3A through 3D are respectively circuit diagrams depicting modifications of a driver circuit employed in the above-described embodiment.
Figure 3B:
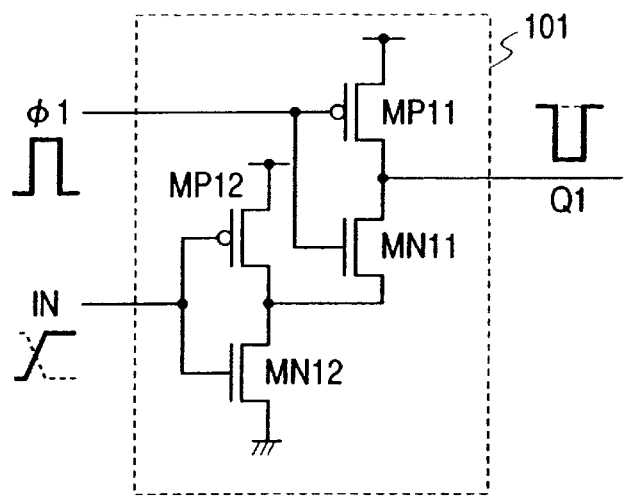
Figure 3C:
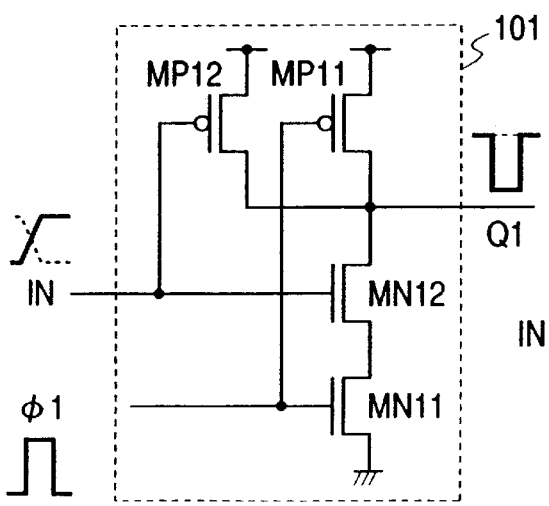

FIGS. 3A through 3D respectively show other driver circuits usable in place of the driver circuit 101 in the transmission circuit shown in FIG. 1. FIG. 3A illustrates a configuration wherein the positions of the transistors MN11 and MN12 of the driver circuit 101 shown in the first embodiment of FIG. 1 are exchanged with one another. FIG. 3B shows a configuration wherein a transistor MP12 is added to FIG. 3A, the gate thereof is electrically coupled to a data signal IN, and the source thereof is electrically connected to the drain of a transistor MN12. FIG. 3C shows a circuit wherein a transistor MP12 is added to the driver circuit 101 shown in FIG. 1. In the present configuration, the gate of the transistor MP12 is coupled to a data signal IN and the source thereof is electrically connected to an output Q1 in this case. If control signals φ1 respectively reach a high potential (evaluation period) when the data signals IN are low in potential, then the outputs Q1 are respectively brought to a floating state during the evaluation period in FIGS. 3A and 3B. However, FIG. 3C shows a configuration capable of preventing the floating state from occurring.

Figure 3D:
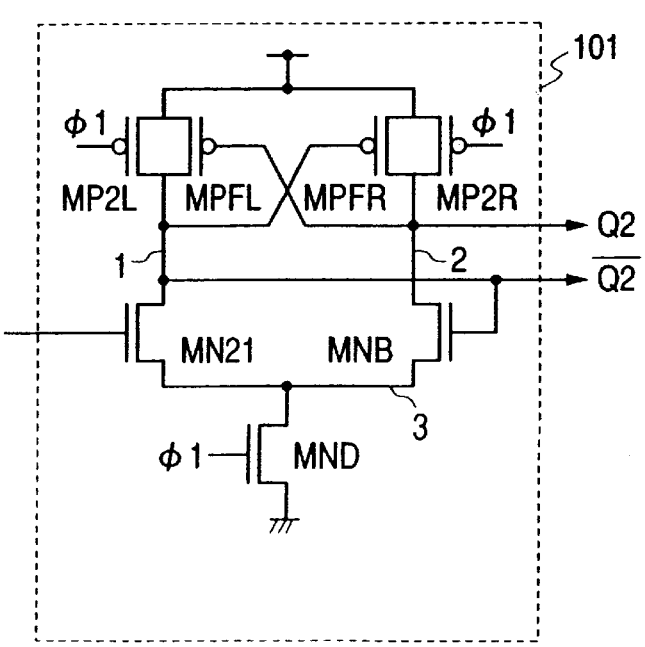

FIG. 3D is an example in which an SCL circuit is used as a driver circuit 101. The circuit shown in FIG. 3D differs from the latch type SCL circuit used as the receiving circuit 201 in the embodiment shown in FIG. 1 in that the feedback transistors MNFL and MNFR are deleted. Since the latch function becomes lost in such a configuration, the circuit can be called a non-latch type SCL circuit. In a manner similar to the driver circuits shown in FIGS. 3A through 3C, these SCL circuits (both the latch and non-latch types) are driven so as to set their output potentials to a high potential during a precharge period, and driven so as to set their output potentials to output potentials based on an input signal during an evaluation period.

As described above, any of the circuits shown in FIGS. 3A through 3D is a circuit wherein its output signal thereof becomes a signal having a precharge period and an evaluation period. Such a circuit is applicable as a driver circuit even in the case of any configuration.

A description will next be made of modifications capable of being used in place of the receiving circuit 201 shown in FIG. 1. Here, of each SCL circuit used as the receiving circuit 201 in FIG. 1, a portion in which an input transistor MN21 and a reference transistor MNB are configured so as to be source-coupled to each other, is called a switch unit SW, a portion comprised of the input transistor MN21 in the switch unit SW is called a logic circuit block LB, a portion comprising precharge transistors MP2L and MP2R and level compensating transistors MPFL and MPFR is called a load unit, and a portion comprising an activation transistor MND is called an activation circuit, respectively.

Figure 4A:
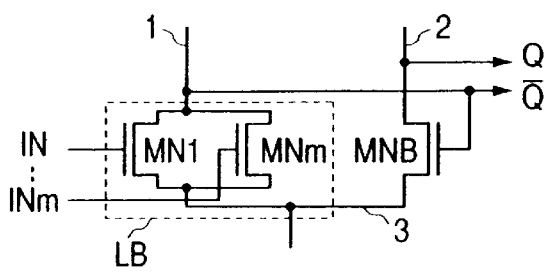
FIGS. 4A through 4H are respectively circuit diagrams showing modifications of a switch unit of a receiving circuit employed in the above-described embodiment.
Figure 4B:
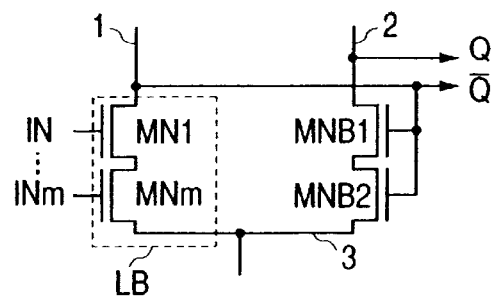
Figure 4C:
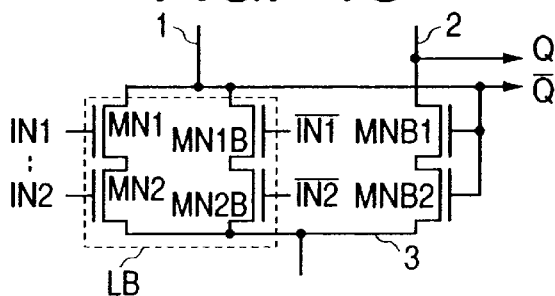
Figure 4D:
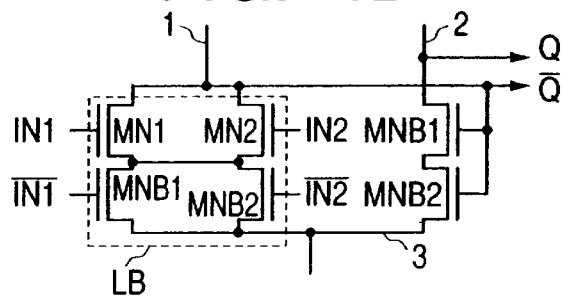
Figure 4E:
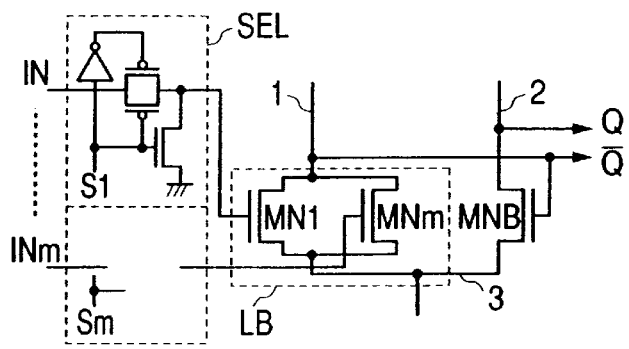
Figure 4F:
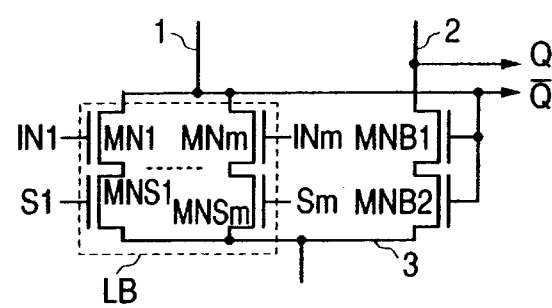

Variations of the switch unit SW in the SCL circuit are illustrated in FIGS. 4A through 4H. In FIG. 4A, a logic circuit block LB comprises a plurality of parallel-connected transistors MN1 through MNm. In this case, the result of OR logic is obtained as an output Q, and the result of NOR logic is obtained as an output $\overline{Q}$. In FIG. 4B, a logic circuit block LB comprises a plurality of tandem connected transistors MN1 through MNm. In this case, reference transistors are also tandem-connected as designated at MNB1 and MNB2. The result of AND logic is obtained as an output Q, and the result of NAND logic is obtained as an output $\overline{Q}$. In FIG. 4C, a logic circuit block LB comprises a pair of two tandem-connected transistors MN1 and MN2 which receive inputs IN1 and IN2 respectively, and a pair of two tandem-connected transistors MNB1 and MNB2 which receive their complementary inputs /IN1 and /IN2 therein, both of which are connected in parallel. In this case, the result of XOR logic is obtained as an output Q and the result of its inverse logic is obtained as an output $\overline{Q}$. In FIG. 4D, a logic circuit block LB comprises a pair of parallel-connected transistors MN1 and MN2 supplied with inputs /IN1 and /IN2 respectively, and a pair of parallel-connected transistors MNB1 and MNB2 supplied with their complementary inputs /IN1 and /IN2, both pairs of which are connected in series. The circuit shown in FIG. 4D obtains the same result of logic as that obtained in the circuit shown in FIG. 4C. FIG. 4E shows a configuration wherein an input to a logic circuit block LB is inputted via a selector SEL. Whether any signal should be transmitted to the logic circuit block LB, is controlled based on select signals S1 through Sm. While FIG. 4F is similar in configuration to FIG. 4C, FIG. 4F is identical in function to FIG. 4E because select signals S1 through Sm are used as signals to be inputted to transistors MNS1 through MNSm. When, for example, the input field effect transistor MN1 and the reference field effect transistor MNB are not configured in tandem as in the case of FIG. 4A, the respective transistors can be replaced by bipolar transistors. Since, in this case, the bipolar transistors rather than the field effect transistors are high or excellent in current switch performance, they are large in amplification degree. As a load unit in this case, a load having a configuration shown in FIG. 6D, which will be described later, is used so as not to saturate the bipolar transistors.

Figure 4G:
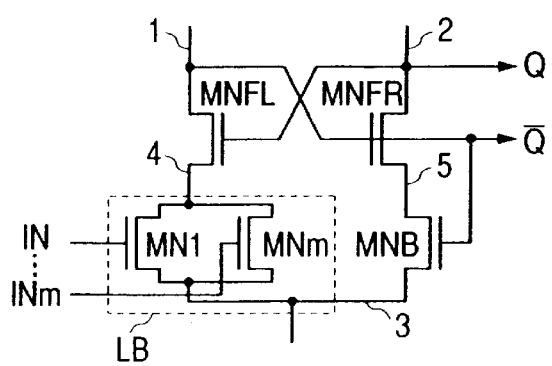
Figure 4H:
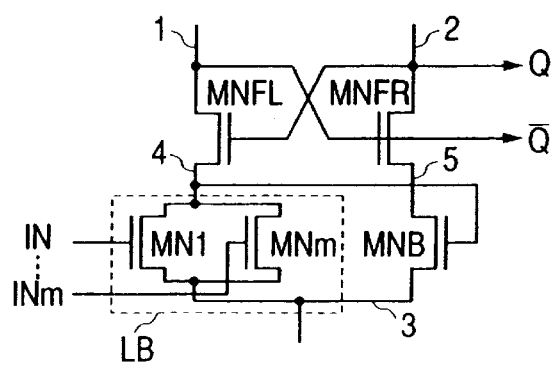
Figure 5:
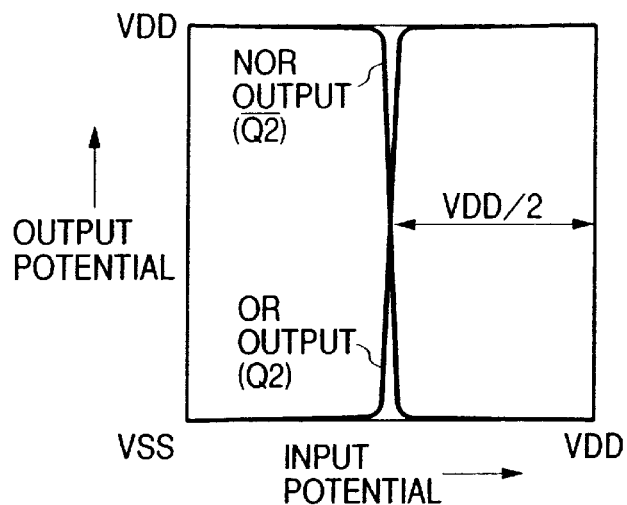
FIG. 5 is a diagram illustrating an input/output characteristic of an SLC circuit described in each of FIGS. 4A through 4F.

Since the receiving circuit, which has adopted each of the switch units shown in FIGS. 4A through 4F described up to now, has no feedback transistors, it serve as a non-latch type SCL circuit. The non-latch type SCL circuit is small in amplification degree and low in logic threshold potential as compared with the latch type SCL circuit as shown in FIG. 5. Thus, a change in input potential larger than that for the latch type SCL circuit is required to make discrimination as to an input potential between a low potential and a high potential. Therefore, a margin greater than that for the latch type SCL circuit is required as a timing margin for each of the input signal Q1B and control signal φ2. Accordingly, the latch type SCL circuit has an advantage in shortening of a delay time. Two feedback transistors whose gates and drains are cross-connected, may be added to configure the latch type SCL circuit and are applicable to any of the circuits shown in FIGS. 4A through 4F. Examples each corresponding to FIG. 4A are shown in FIGS. 4G and 4H. In a switch unit shown in FIG. 4G, the gate of a reference transistor MNB is electrically connected to a node 1 (output $\overline{Q}$) in a manner similar to the receiving circuit 201 employed in the first embodiment shown in FIG. 1. In a switch unit shown in FIG. 4H, the gate of a reference transistor MNB is electrically connected to a node 4 corresponding to one terminal of a logic circuit block LB. Since the potential applied to the gate of a reference transistor MNB at precharge becomes a potential lowered by a threshold voltage as compared with a high potential VDD in FIG. 4H, a logic threshold potential is also reduced. Accordingly, the circuit shown in FIG. 4G is advantageous in speeding-up.

Figure 6A:
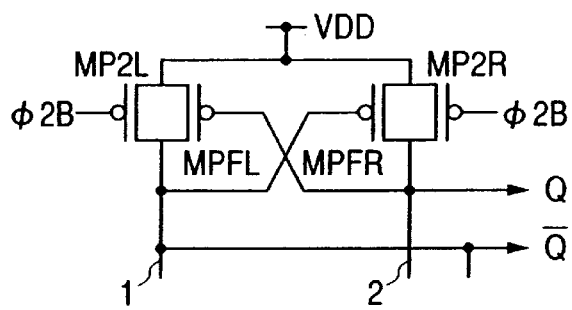
FIGS. 6A through 6D are respectively circuit diagrams depicting modifications of a load unit of the receiving circuit employed in the above-described embodiment.
Figure 6B:
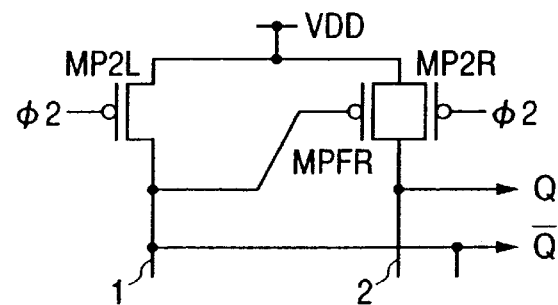
Figure 6C:
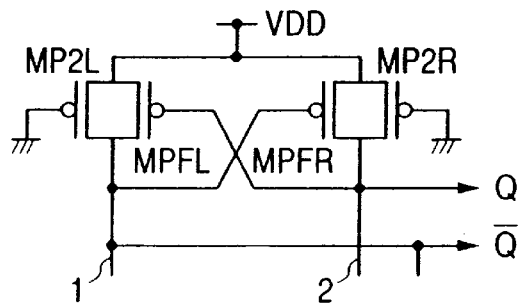
Figure 6D:
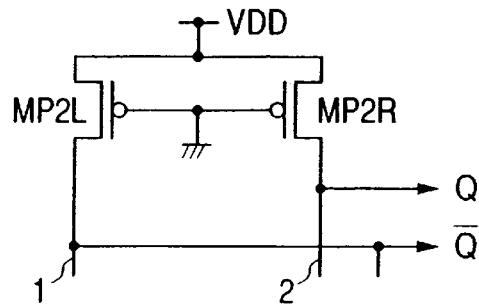

FIGS. 6A through 6D respectively show variations of a load unit of an SCL circuit adoptable as a receiving circuit. In FIG. 6A, the gates of precharge transistors MP2L and MP2R are driven based on a control signal $\phi 2B$ different from the control signal $\phi 2$ for the activation circuit. Owing to the driving of the control signal $\phi 2B$ with timing faster than that for the control signal $\phi 2$, the SCL circuit can be speeded up in a manner similar to the commonly available domino circuit as compared with the driving of the two with the same timing. FIG. 6B shows a configuration in which the level compensating MPFL is deleted. Although a drawback arises in that an output node $\overline{Q}$ is brought to a floating state during an evaluation period in this case, the effect of reducing an area is brought about. In FIG. 6C, the gates of precharge transistors MP2L and MP2R are always driven based on a low potential VSS. In this case, the signal amplitude of each of outputs (Q and $\overline{Q}$) can be set to an arbitrary amplitude without being set to a full amplitude. When the amplitude thereof is small, level compensating transistors MPFL and MPFR become unnecessary in a manner similar to FIG. 6D and hence an area reducing effect is brought about.

Figure 7A:
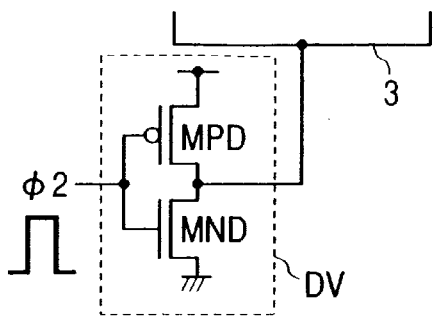
FIGS. 7A through 7C are respectively circuit diagrams showing modifications of an activation circuit of the receiving circuit employed in the above-described embodiment.
Figure 7B:
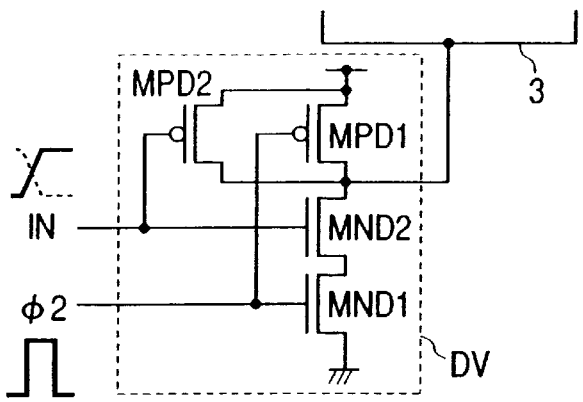
Figure 7C:
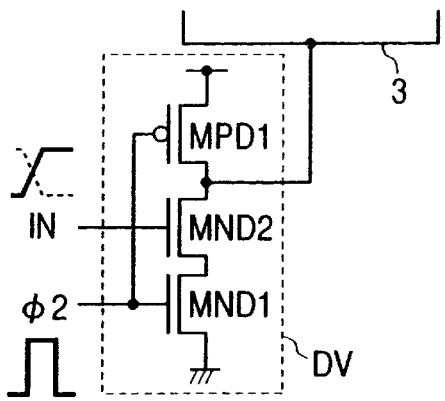

FIGS. 7A through 7C respectively show variations of an activation circuit of an SCL circuit applicable as a receiving circuit. In FIG. 7A, an activation circuit DV comprises an inverter comprised of transistors MPD and MND. The input of the inverter is coupled to a control signal $\phi 2$ and the output thereof is electrically connected to a node 3 of a source-coupled unit of an SCL circuit. When the transistor MPD is not provided, the node 3 is precharged by a reference transistor MNB. On the other hand, when the transistor MPD exists, the node 3 is precharged by both transistors MPD and MNB. Therefore, the time required to precharge the node 3 and an output node Q is shortened. In FIG. 7B, an activation circuit DV comprises a plural-input NAND circuit (two-input type in the drawing by way of example). In such a configuration, even when a control signal $\phi 2$ is brought to an activated state (high potential), a SCL circuit is activated only when all the inputs of the NAND circuit are high in potential, and are not activated except for that, whereby power consumption is reduced.

FIG. 7C is a modification of FIG. 7B and shows a configuration in which a transistor MPD2 is deleted. When a data signal IN is low in potential and a control signal $\phi 2$ is brought to an activated state (high potential) in this case, a node 3 is brought to a floating state but the transistor MPD2 is not necessary and essential to the configuration.

Figure 9:
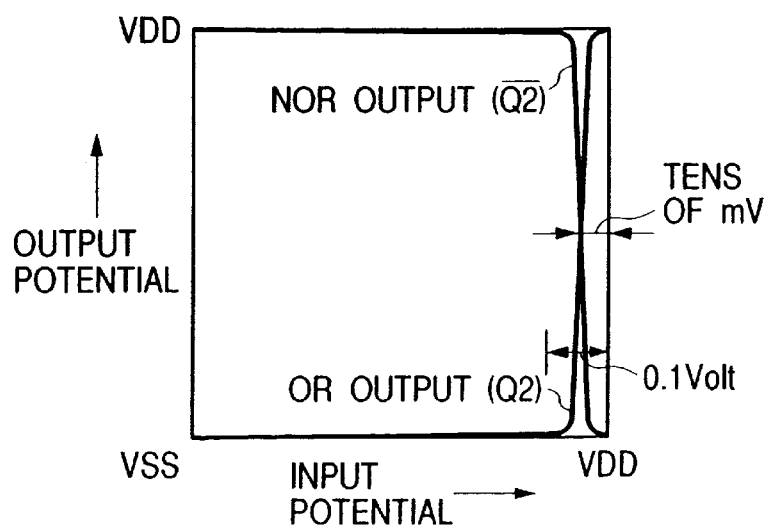
FIG. 9 is a diagram depicting an input/output characteristic of the receiving circuit employed in the above-described embodiment.
Figure 8:
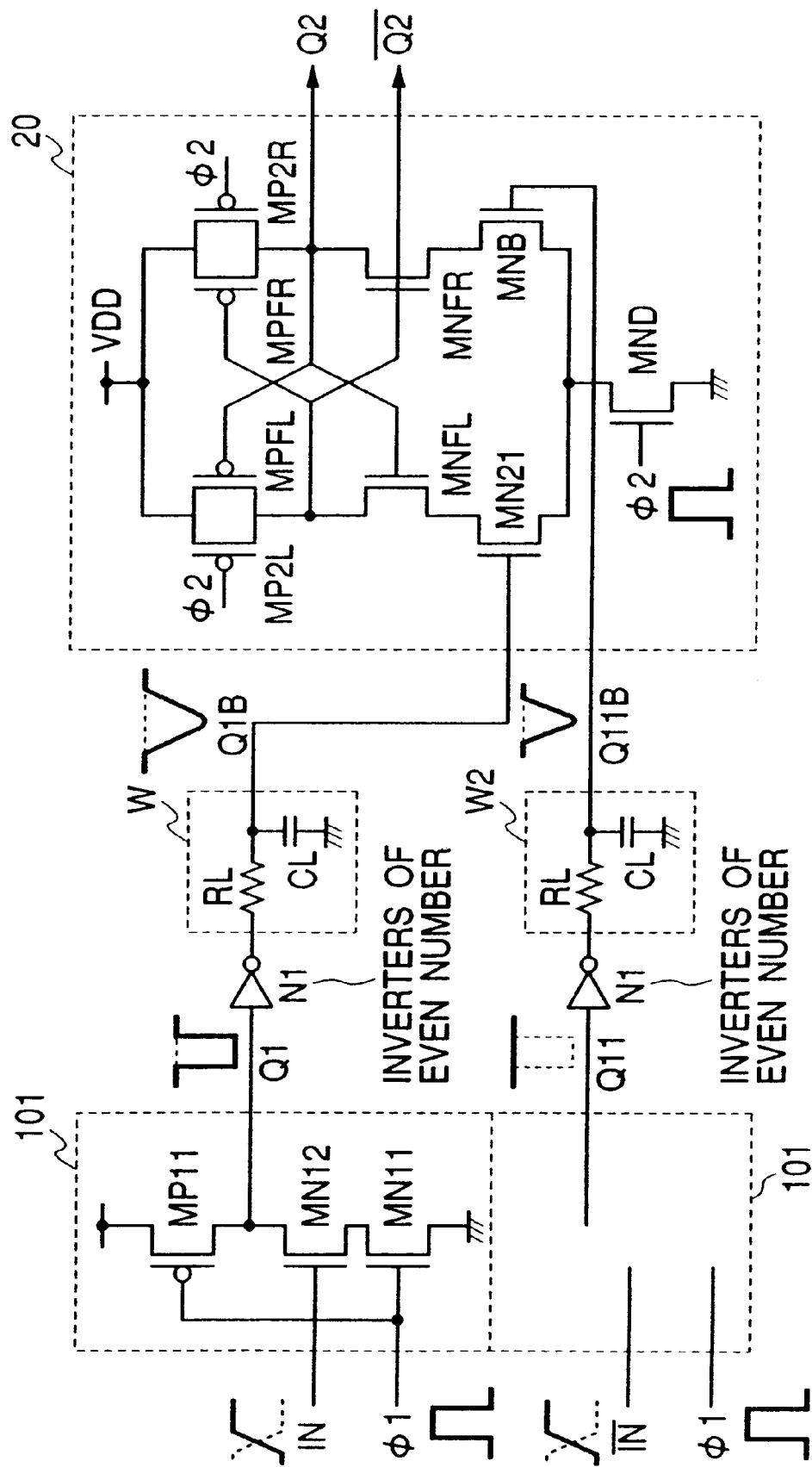
FIG. 8 is a circuit diagram illustrating a second embodiment.

An example in which input signal lines are a complementary signal pair, is next shown in FIG. 8 as a second embodiment. As compared with the first embodiment shown in FIG. 1, the embodiment shown in FIG. 8 is provided with another driver circuit 101' identical in configuration to the driver circuit 101. They differ from each other in that the driver circuits are activated complementarily. Namely, an input signal IN of the driver circuit 101 has a complementary bearing on an input signal /IN of the driver circuit 101'. Thus, a signal wire W driven by the driver circuit 101 and a complementary signal wire W2 driven by the driver circuit 101' are respectively charged to a high potential VDD during a precharge period. During an evaluation period, one of them is discharged to a low potential VSS, where the other thereof remains at VDD. The receiving circuit 202 is substantially similar in internal configuration to the receiving circuit 201 employed in the embodiment shown in FIG. 1 but different therefrom in that a reference transistor MNB is electrically connected to the complementary signal wire W2 without being connected to a node $\overline{Q2}$. Since a logic threshold potential is a potential lowered by several tens of mV from the high potential in the present receiving circuit 201 as represented by an input/output characteristic shown in FIG. 9, the receiving circuit 202 discriminates between the low potential and the high potential if the difference in potential between the wire W and the wire W2 corresponding to the complementary signal line pair is 0.1V or higher. Thus, since timing margins for each input signal and the control signal $\phi 2$ can be shortened as compared with the receiving circuit 201 employed in the first embodiment shown in FIG. 1, a further speed-up is achieved. However, this is implemented in compensation for such cumbersomeness that the driver circuits and the signal wires increase twice.

FIG. 10 shows another receiving circuit employed in the second embodiment. The receiving circuit 201 shown in the present drawing is of a commonly-used latch type sense amplifier and has an input/output characteristic similar to that of the receiving circuit employed in the second embodiment. Thus, since timing margins for input signals Q1B and Q1B and a control signal $\phi 2$ can be shortened in a manner similar to the receiving circuit employed in the second embodiment, the speeding up of the receiving circuit is achieved. Since, however, an input node also serves as an output node in the present embodiment, an input signal line is driven at full amplitude. Therefore, power consumption is large as compared with the second embodiment shown in FIG. 8. Incidentally, a latch circuit completely identical in configuration to the receiving circuit 202 shown in FIG. 8 or the receiving circuit 203 shown in FIG. 10 may be used even in the driver circuits 101 and 101' shown in FIG. 8.

Figure 12:
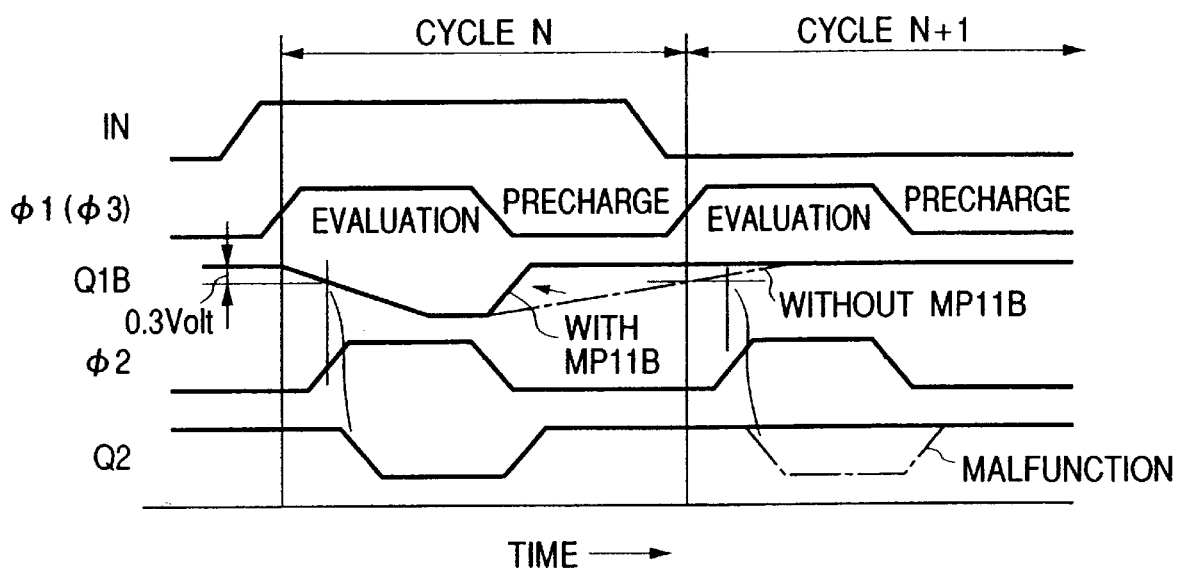
FIG. 12 is a diagram depicting operation waveforms and effects obtained in the third embodiment.

Next, an embodiment for achieving further shortening of a transmission cycle time is illustrated in FIG. 11. The present embodiment is different from the embodiment shown in FIG. 1 in that a signal line precharge transistor MP11B is additionally provided on the input side of a receiving circuit 201. A problem which arises when the signal line precharge transistor MP11B is not provided, will first be explained using an operational waveform shown in FIG. 12. When a control signal $\phi 1$ of a driver circuit 101 changes from 'H' to 'L' and thereby a precharge operation is started by a transistor MP11 of the driver circuit, a long time interval is required up to the completion of a precharge operation at an exit Q1B of a wire W due to the influence of wiring resistance and capacitance as indicated by a dashed line at Q1B in FIG. 12. In the case of the waveform indicated by the dashed line, even if a control signal $\phi 2$ is switched from 'L' to 'H' in the next cycle and the receiving circuit 201 reaches its activated timing, the precharge operation at Q1B is not completed and the receiving circuit 201 reaches a malfunction operation in which error data is outputted. Avoiding the occurrence of the malfunction operation needs to lengthen a cycle time up to the time for the completion of the precharge operation at Q1B. In other words, the cycle time is rate-controlled by the time for the completion of the precharge operation at Q1B. In order to make countermeasures against it, the signal line precharge transistor MP11B is additionally provided in the embodiment shown in FIG. 11. The drain of the transistor MP11B is electrically connected to the exit Q1B of the wire W and a control signal φ3 is inputted to the gate of the transistor MP11B. Timing provided to input the control signal φ3 is important in the present invention. Namely, if timing provided to raise the control signal φ3 is delayed with respect to the control signal φ1 where a data signal IN is 'H' and the control signal φ1 rises so as to change from a precharge state to an evaluation state, then transistors MN11, MN12 and MP11B are brought into conduction during its delayed period so that a through current flows therethrough. No particular problem arises in the case of inverse timing. On the other hand, if timing provided to cause the control signal φ3 is faster than that for the control signal φ1 where the control signal φ1 falls, then the transistors MN11, MN12 and MP11B are brought into conduction during a period corresponding to the difference in timing therebetween so that a through current flows therethrough. When the falling timing of the control signal φ3 is delayed with respect to the falling timing of the control signal φ1 in reverse, then the precharge operation at the exit Q1B of the wire W by the transistor MP11B is delayed correspondingly. Avoiding the occurrence of these problems needs the best condition that, for example, the rising and falling timings for the control signal φ3 is synchronized with the control signal φ1. FIG. 12 shows the best conditions established for φ1 and φ3. According to the present embodiment in this case, the precharge operation at the exit Q1B of the wire W is carried out substantially without being under the influence of parasitic capacitance and resistance of the wire W. Accordingly, the waveform at the exit Q1B of the wire W rises at high speed as indicated by a sold line as compared with the prior circuit. It is therefore possible to shorten the cycle time.

Figure 13:
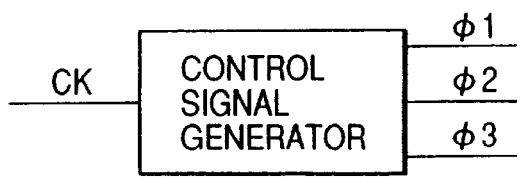
FIG. 13 is a conceptional diagram showing a control signal generating method.
Figure 14:
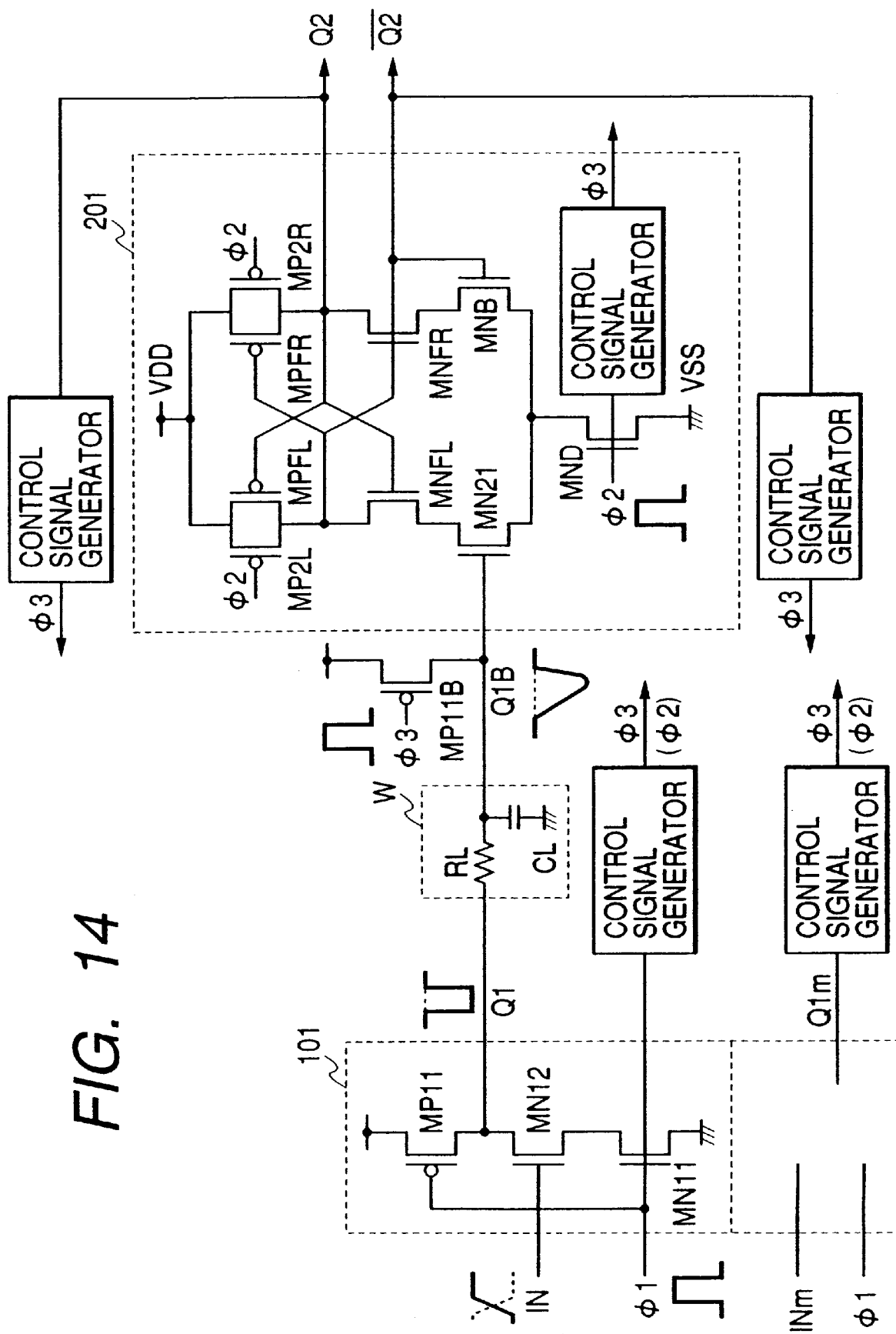
FIG. 14 is a conceptional diagram illustrating another control signal generating method.

A control signal generating method will next be described. FIG. 13 shows a method of generating control signals φ1, φ2 and φ3, based on an external clock CK. The control signals φ1, φ2 and φ3 are generated as outputs produced from a control signal generator with the external clock CK as an input. The control signals φ1, φ2 and φ3 are supplied to the driver circuit, receiving circuit and signal line precharge transistor. FIG. 14 shows another example of the control signal generating method. For example, the control signal φ2 or φ3 is generated based on the control signal φ1 of the driver circuit 101. Alternatively, the control signal φ2 or φ3 is generated based on an output signal Q1 (or Q1m) of the driver circuit 101. As an alternative to the above, the control signal φ3 can be generated based on the control signal φ2 or output signals Q2 and $\overline{Q2}$ of the receiving circuit 201.

Figure 15:
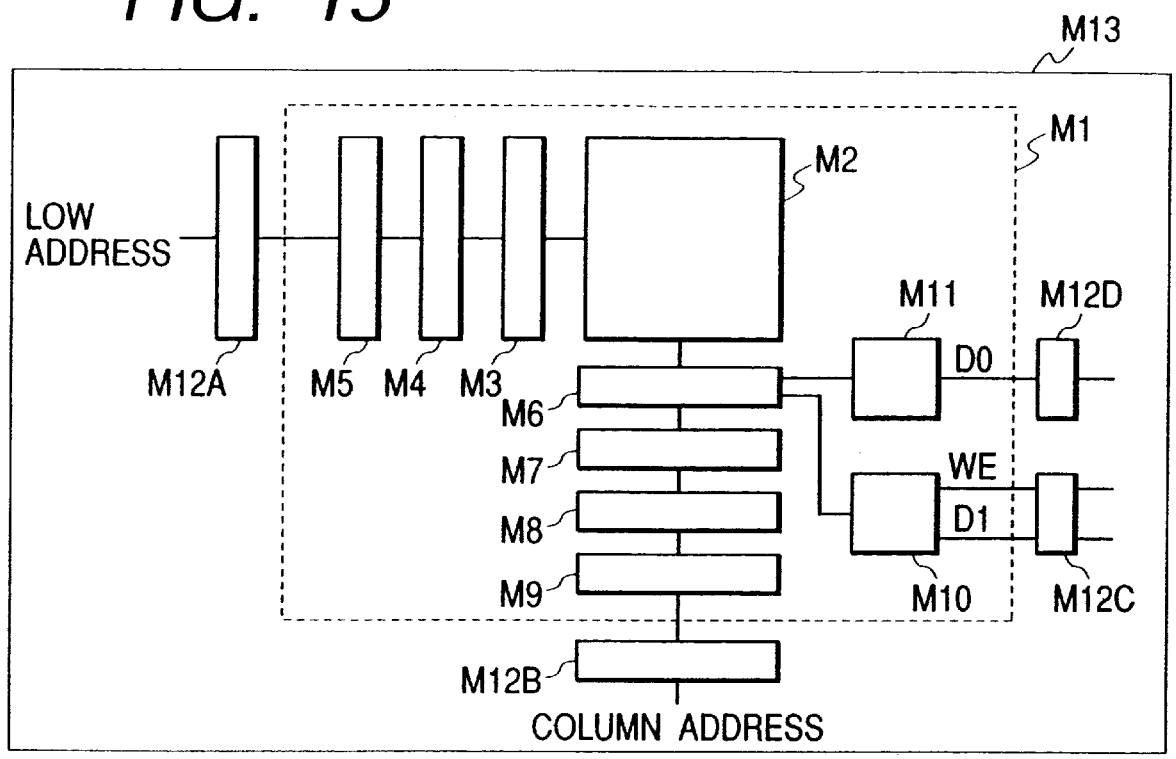
FIG. 15 is a block diagram depicting a fourth embodiment.

A description will be made of an example in which the present transmission circuit is applied to a semiconductor integrated circuit and a semiconductor memory. An entire block diagram of the semiconductor integrated circuit is shown in FIG. 15 as a fourth embodiment. A semiconductor integrated circuit M13 has a semiconductor memory macro M1, i.e., a memory cell array M2, a row decoder and word driver M3, a row predecoder M4, a row address buffer M5, a read-write circuit M6, a column decoder and driver M7, a column predecoder M8, a column address buffer M9 and a read-write control circuit M10, an output circuit M11, and driver circuits 12A through 12D for transmitting signals to and receiving the same from the respective input/output circuits of the semiconductor memory macro M1. The memory cell array M2 has a number of memory cells in which memory cell select terminals are electrically connected to their corresponding word lines and memory cell output terminals are electrically connected to their corresponding bit lines. Theses memory cells are placed in matrix form. The row address buffer M5 converts a row address signal to an internal complementary address signal and the row predecoder M4 decodes the converted signal. Further, the row decoder and word driver M3 decodes it and drives a word line selected based on the result of decoding to a selection level. The column address buffer M9 converts a column address signal to an internal complementary address signal and the column predecoder M8 decodes the converted signal. Further, the column decoder and driver M7 decodes the result of decoding. The corresponding bit line is selected according to the result of decoding by the column decoder and driver M7. A memory cell specified by the row address signal and the column address signal is selected in this way.

Here, the driver circuits M12 through M12C for transmitting the signals to their corresponding input circuits of the semiconductor memory macro M1 correspond to the driver circuit 101. An output line thereof corresponds to the signal wire W or the signal wire W and complementary signal wire W2. The row address buffer M5, the column address buffer M9 and the read-write control circuit M10 comprise the receiving circuit 201. Further, the output circuit M11 corresponds to the driver circuit 101, and an output line thereof corresponds to the signal wire W or the signal wire W and complementary signal wire W2. As a result of the constitution of the driver circuit M12D by the receiving circuit 201, the time necessary for the driver circuit M12D to transmit a data signal to the semiconductor memory macro M1 is shortened owing to the above speeding-up effect.

Figure 16:
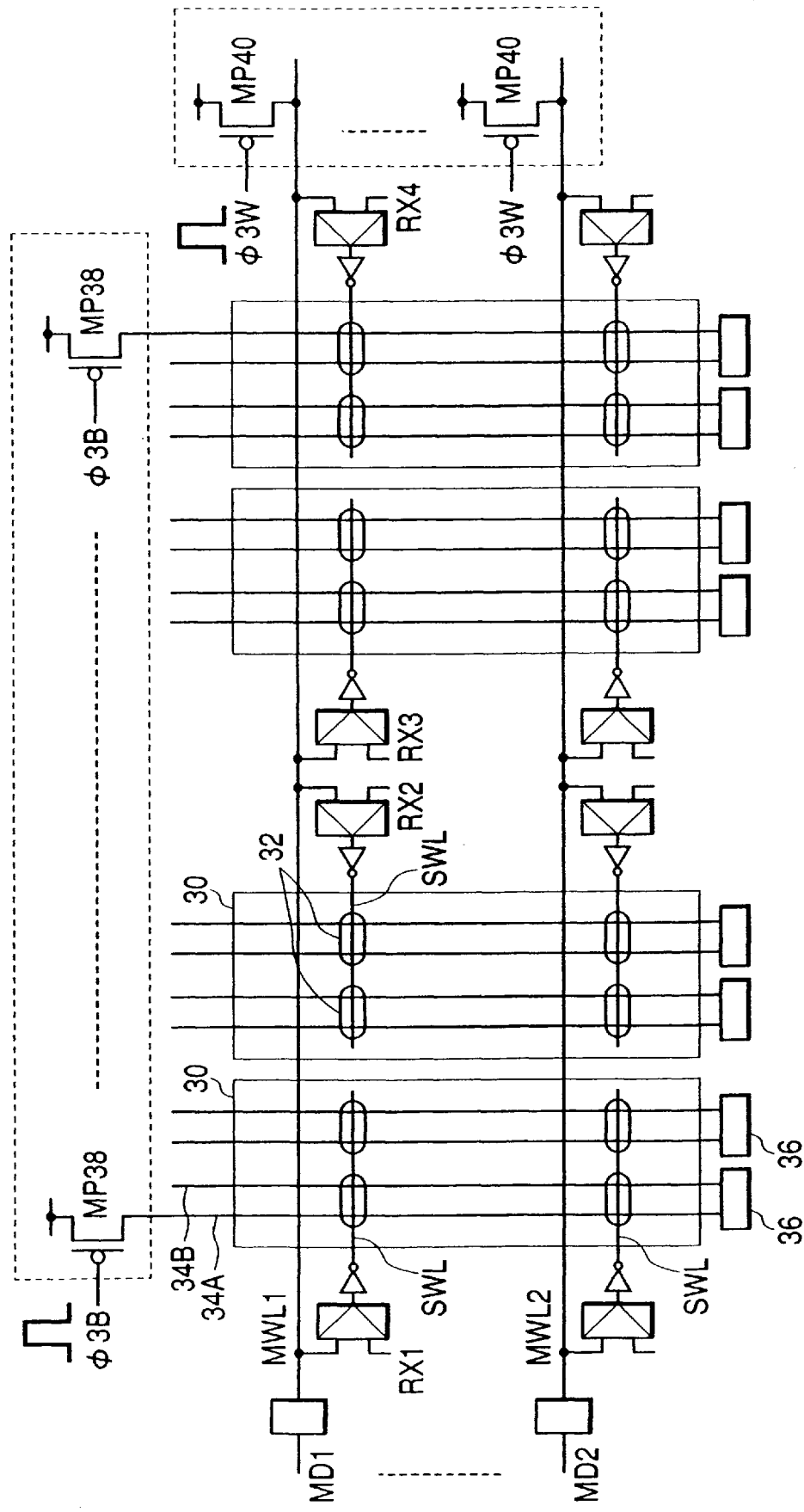
FIG. 16 is a circuit diagram showing a fifth embodiment.

The memory cell array and peripheral circuits of the semiconductor memory macro M1 (or semiconductor memory) are shown in FIG. 16 as a fifth embodiment. The memory cell array in which a number of memory cells 32 are two-dimensionally arranged, is divided into a plurality of sub memory arrays 30. A plurality of sub word drivers RX1, RX2, RX3 and RX4 are respectively electrically connected to main word lines typified by MWL1 and MWL2. Sub word lines SWL respectively corresponding to the sub memory arrays are electrically connected to their corresponding sub word drivers. Read-write control circuits 36 are electrically connected to their corresponding bit line pairs each typified by 34A and 34B. Precharge transistors MP38 are electrically connected to their corresponding ends of the bit lines.

The main word lines MWL1 and MWL2 are respectively driven by word drivers MD1 and MD2. The driver circuit 101 shown in FIG. 1 or those shown in FIGS. 3A through 3D are adopted as the main word drivers MD1 and MD2. At this time, a signal to be inputted to the driver circuit corresponds to an output produced from a row decoder for selecting each row of the memory cell array. Each of the main word lines MWL1 and MWL2 corresponds to the signal wire W shown in FIG. 1. Precharge transistors MP40 each similar to the MP11B shown in FIG. 11 are respectively electrically connected to the far-off ends of these main word lines as viewed from the word drivers. The receiving circuit 201 shown in FIG. 1 or the receiving circuits taking the diverse variations shown in FIGS. 3A through 3D, FIGS. 4A through 4D and FIGS. 6A through 6C are adopted as the sub word drivers RX1 through RX4. Namely, each of the main word drivers is alternately controlled to a precharge period and an evaluation period according to a first control signal. During the precharge period, the main word driver precharges each main word line to a high potential VDD and drives it to either the high potential VDD or a low potential VSS according to the output of the row decoder. Each of the sub word drivers has a first node and a second node to which the corresponding one of the sub word lines is connected. The sub word driver is alternately controlled to the precharge period and the evaluation period according to a second control signal. During the precharge period, the sub word driver precharges the first and second nodes to a first source potential together. During the evaluation period, the sub word driver discharges the second node according to the potential at the first node and discharges the first node according to the potential at each main word line. Thus, the potential at the main word line is discriminated from another with the potential at the first node as a reference potential so that the corresponding connected sub word line is driven. Owing to such a configuration, the time required to drive each main word line can be shortened.

Figure 17:
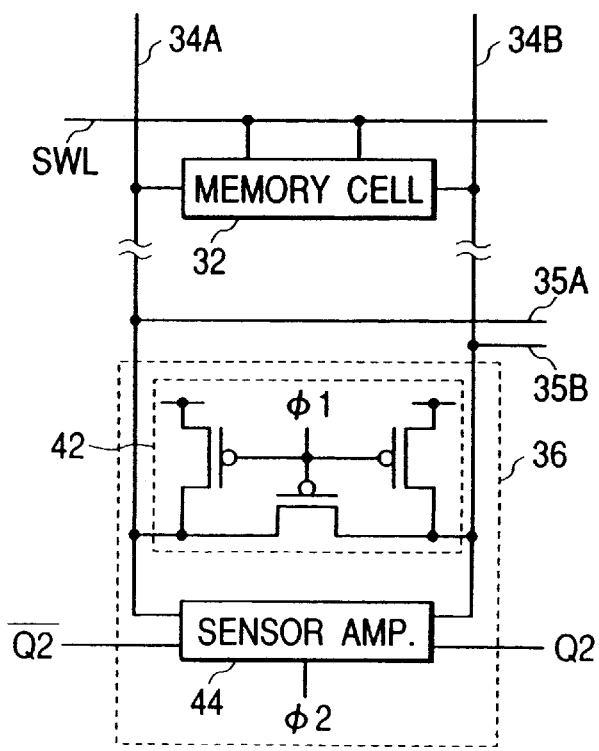
FIG. 17 is a diagram illustrating a read/write control circuit employed in the fifth embodiment.

Further, the receiving circuit shown in FIG. 8 or the like is used for the read-write control circuit 36 to make it possible to shorten the time required to drive each bit line. This will be explained with reference to FIG. 17. FIG. 17 shows one example of the read-write control circuit 36 applied to the fifth embodiment and its periphery. Only one is typically illustrated as a memory cell electrically connected to a bit line pair 34A and 34B. Reference numerals 35A and 35B are respectively common data lines used for data writing. The read-write control circuit 36 comprises a pull-up circuit 42 and a sense amplifier 44. The receiving circuit 202 shown in FIG. 8 or the receiving circuit 203 shown in FIG. 10 can be adopted as the sense amplifier 44. Thus, a portion comprising the memory cell 32 and the pull-up circuit 42 corresponds to the driver circuit 101 of the transmission circuit shown in FIG. 8. Further, the bit lines 34A and 34B correspond to the signal wire W and the signal wire W2 respectively. The pull-up circuit 42 is driven by a control signal φ1 substantially in synchronism with a signal on a sub word line. Namely, when the sub word line is low in potential, the control signal φ1 is also low in potential. Thus, the bit line pair 34A and 34B is precharged to a high potential by transistors of the pull-up circuit. On the other hand, when the selected sub word line SWL reaches a high potential, the control signal φ1 is also high in potential and hence the pull-up circuit reaches an evaluation state. If the corresponding memory cell is in an information read state, for example at this time, then the difference in potential, which is developed between the bit line pair 34A and 34B, is amplified by the sense amplifier 44 or 201 as described above, and output signals Q2 and $\overline{Q2}$ are supplied to the next-stage circuit.

Figure 20:
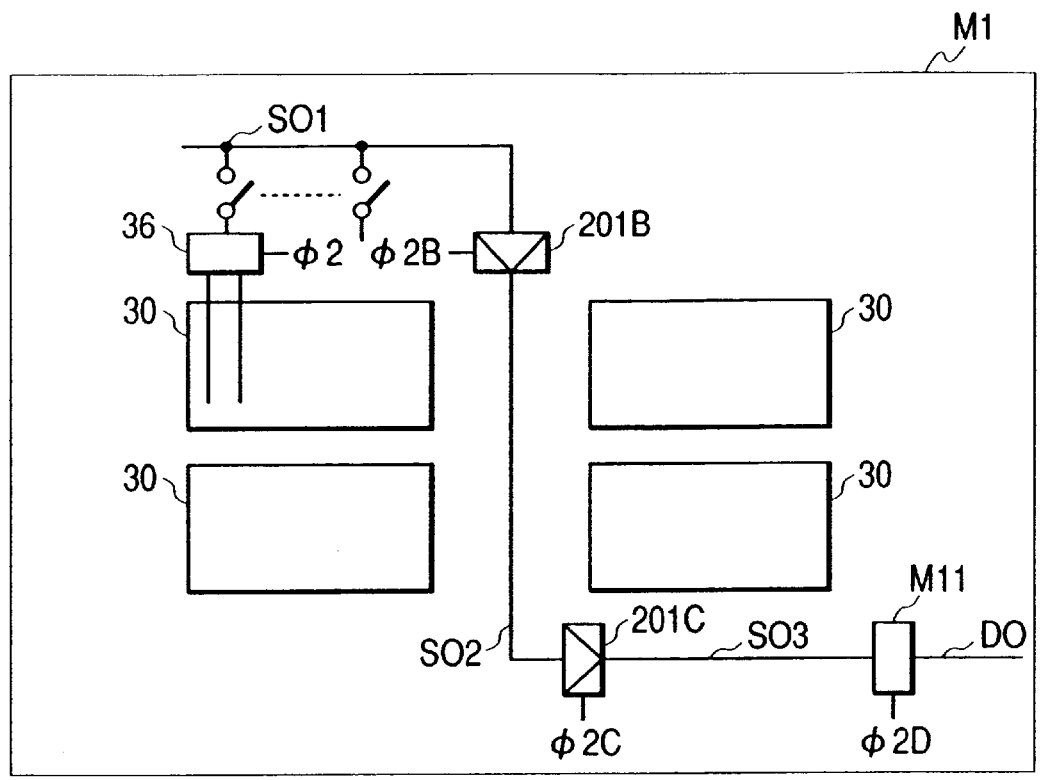
FIG. 20 is a block diagram illustrating a sixth embodiment.

FIG. 20 shows a sixth embodiment. The present embodiment illustrates an example in which an output produced from the read-write control circuit 36 employed in the fifth embodiment is transmitted to an output circuit M11. Namely, an output SO1 produced from the read-write control circuit 36 is received by a receiving circuit 201B driven by a control signal φ2B. An output SO2 produced from the receiving circuit 201C driven by a control signal φ2C. Further, an output SO3 produced from the receiving circuit 201C is received by the output circuit M11 driven by a control signal φ2D. The above S01 through SO3 respectively correspond to the signal lines of the transmission circuits shown in FIG. 1 and the like. The receiving circuits 201B, 201C and output circuit M11 respectively correspond to the receiving circuit in the transmission circuit. Owing to the present embodiment, an access time for a semiconductor memory macro (or semiconductor memory) is shortened as described above.

Figure 21:
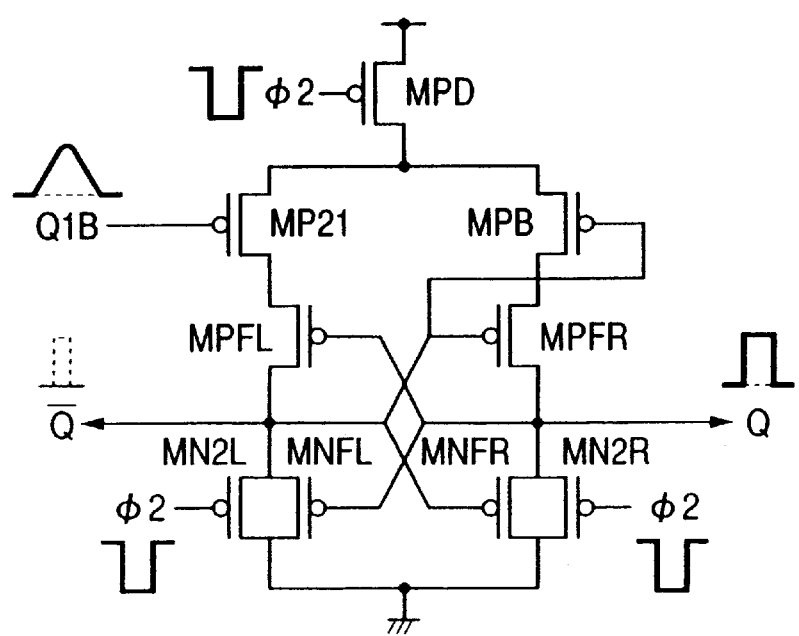
FIG. 21 is a circuit diagram depicting another driver circuit and another receiving circuit employed in the present embodiment.

FIG. 21 shows another receiving circuit employed in the present embodiment. The present embodiment takes a form wherein the receiving circuit 201 employed in the first embodiment shown in FIG. 1 is turned upside down and the respective signals are made opposite in polarity. While the signals are different in polarity from one another, the present receiving circuit can obtain an effect similar to the receiving circuit 201 employed in the first embodiment even in the case of such a configuration. Namely, a modification of the above embodiment, wherein an n type device is replaced by a p type device and a p type device is replaced by an n type device, falls within a scope capable of being inferred and considered by those skilled in the art. Since the polarities of the output signals and the inverted input signal are changed, the addition of another inverter to an output point also falls within an easy-to-infer scope.

Figure 22:
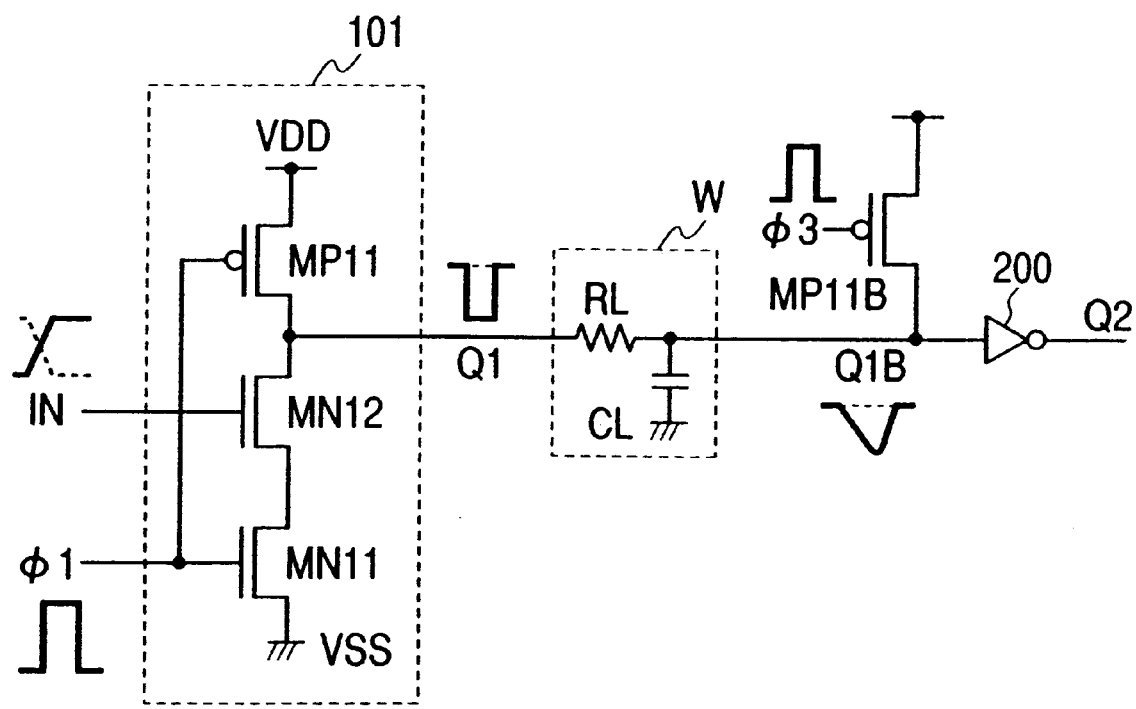
FIG. 22 is a circuit diagram showing a seventh embodiment.

FIG. 22 shows a seventh embodiment of the present invention. The present embodiment adopts a configuration in which the signal line precharge transistor MP11B is added to the input side of the receiving circuit 201 employed in the prior art shown in FIG. 18. According to the present configuration, since an advantage is obtained in that a precharge time at an exit portion of a signal wire W can be shortened while the effect of shortening the time required to transmit a data signal is not obtained, a transmission cycle time can be shortened. Thus, according to the signal line precharge transistor MP11B, the transmission cycle time can be shortened regardless of the type of receiving circuit.

According to the present invention, even when the waveform of a signal is made dull due to a long wire, for example, it is possible to transmit data in a short time or transmit it in a high-speed cycle. It is also feasible to shorten an access time for a semiconductor memory.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A transmission circuit comprising:
    a driver circuit alternately controlled to a precharge period and an evaluation period according to a first control signal, said driver circuit precharging an output node to a first source potential during the precharge period and driving the output node to either one of the first source potential and a second source potential according to a potential at an input node during the evaluation period;
    a signal line coupled to the output node of said driver circuit so as to be driven by said driver circuit; and
    a receiving circuit having a first node and a second node, said receiving circuit being alternately controlled to the precharge period and the evaluation period according to a second control signal to precharge the first and second nodes to the first source potential together during the precharge period, and discharge the second node according to a potential at the first node and discharge the first node according to a potential on said signal line during the evaluation period, thereby making a distinction as to the potential on said signal line with the potential at the first node as a reference potential;
    wherein said receiving circuit includes,
        a first load provided between the first source potential and the first node and driven based on the second control signal;

a second load provided between the first source potential and the second node and driven based on the second control signal;

an activation circuit provided between a third node and the second source potential, for driving the third node to the second source potential during the evaluation period;

a first feedback field effect transistor having a source-to-drain path inserted between the first node and a fourth node and a gate connected to the second node;

a second feedback field effect transistor having a source-to-drain path inserted between the second node and a fifth node and a gate connected to the first node;

an input field effect transistor having a source-to-drain path inserted between the third node and the fourth node and a gate to which said signal line is connected; and a reference field effect transistor having a source-to-drain path inserted between the third node and the fifth node and a gate connected to the first node.

2. A transmission circuit according to claim 1, wherein said activation circuit in said receiving circuit comprises a field effect transistor whose source-to-drain path is inserted between the third node and the second source potential and whose gate is coupled to the second control signal.

3. A transmission circuit according to claim 1, wherein said activation circuit is an inverter which receives the second control signal as an input and whose output is connected to the third node.

4. A transmission circuit according to claim 1, wherein said activation circuit comprises a plural-input logic circuit whose any of plural inputs is the second control signal and whose output is connected to the third node.

5. A transmission circuit according to claim 1, wherein said first load comprises a first precharge field effect transistor having one end of a source-to-drain path thereof, to which the first source potential is applied, the other end thereof connected to the first node and a gate to which the second control signal is applied, and a first level compensating field effect transistor having one end of a source-to-drain path thereof, to which the first source potential is applied, the other end thereof connected to the first node, and a gate connected to the second node, and said second load comprises a second precharge field effect transistor having one end of a source-to-drain path thereof, to which the first source potential is applied, the other end thereof connected to the second node and a gate to which the second control signal is applied, and a second level compensating field effect transistor having one end of a source-to-drain path thereof, to which the first source potential is applied, the other end thereof connected to the second node, and a gate connected to the first node.

6. A transmission circuit according to claim 1, wherein said first load comprises a first precharge field effect transistor having one end of a source-to-drain path thereof, to which the first source potential is applied, the other end thereof connected to the first node, and a gate to which the second control signal is applied, and said second load comprises a second precharge field effect transistor having one end of a source-to-drain path thereof, to which the first source potential is applied, the other end thereof connected to the second node, and a gate to which the second control signal is applied; and a level compensating field effect transistor having one end of a source-to-drain path thereof, to which the first source potential is applied, the other end thereof connected to the second node, and a gate connected to the first node.

7. A transmission circuit according to claim 1, wherein said first load comprises a first precharge field effect transistor having one end of a source-to-drain path thereof, to which the first source potential is applied, the other end thereof connected to the first node, and a gate to which the second control signal is applied, and said second load comprises a second precharge field effect transistor having one end of a source-to-drain path thereof, to which the first source potential is applied, the other end thereof connected to the second node, and a gate to which the second control signal is applied.

8. A transmission circuit according to claim 1, wherein said first load comprises a first precharge field effect transistor having one end of a source-to-drain path thereof, to which the first source potential is applied, the other end thereof connected to the first node, and a gate connected to the second source potential, and said second load comprises a second precharge field effect transistor having one end of a source-to-drain path thereof, to which the first source potential is applied, the other end thereof connected to the second node, and a gate connected to the second source potential.

9. A transmission circuit comprising:

a driver circuit alternately controlled to a precharge period and an evaluation period according to a first control signal, said driver circuit precharging an output node to a first source potential during the precharge period and driving the output node to either one of the first source potential and a second source potential according to a potential at an input node during the evaluation period;

a signal line coupled to the output node of said driver circuit so as to be driven by said driver circuit; and a receiving circuit having a first node and a second node, said receiving circuit being alternately controlled to the precharge period and the evaluation period according to a second control signal to precharge the first and second nodes to the first source potential together during the precharge period, and discharge the second node according to a potential at the first node and discharge the first node according to a potential on said signal line during the evaluation period, thereby making a distinction as to the potential on said signal line with the potential at the first node as a reference potential;

wherein said second control signal is generated based on the first control signal.

10. A transmission circuit comprising:

a driver circuit alternately controlled to a precharge period and an evaluation period according to a first control signal, said driver circuit precharging an output node to a first source potential during the precharge period and driving the output node to either one of the first source potential and a second source potential according to a potential at an input node during the evaluation period;

a signal line coupled to the output node of said driver circuit so as to be driven by said driver circuit; and a receiving circuit having a first node and a second node, said receiving circuit being alternately controlled to the precharge period and the evaluation period according to a second control signal to precharge the first and second nodes to the first source potential together during the precharge period, and discharge the second node according to a potential at the first node and discharge the first node according to a potential on said signal line during the evaluation period, thereby making a distinction as to the potential on said signal line with the potential at the first node as a reference potential;

wherein said second control signal is generated based on the output of said driver circuit.

11. A transmission circuit comprising:

a driver circuit alternately controlled to a precharge period and an evaluation period according to a first control signal, said driver circuit precharging an output node to a first source potential during the precharge period and driving the output node to either one of the first source potential and a second source potential according to a potential at an input node during the evaluation period;

a signal line coupled to the output node of said driver circuit so as to be driven by said driver circuit; and a receiving circuit having a first node and a second node, said receiving circuit being alternately controlled to the precharge period and the evaluation period according to a second control signal to precharge the first and second nodes to the first source potential together during the precharge period, and discharge the second node according to a potential at the first node and discharge the first node according to a potential on said signal line during the evaluation period, thereby making a distinction as to the potential on said signal line with the potential at the first node as a reference potential;

further including a precharge field effect transistor having one end of a source-to-drain path thereof, to which the first source potential is connected, the other end thereof connected to said signal line, and a gate to which a third control signal is applied, said precharge field effect transistor being controlled based on the third control signal to thereby give an additional precharge path to said signal line during a precharge period of said driver circuit.

12. A transmission circuit according to claim 11, wherein said driver circuit is connected to one end of said signal line and said precharge field effect transistor is connected to the other end thereof.

13. A transmission circuit according to claim 11, wherein said third control signal is generated based on a signal outputted from said receiving circuit.

14. A transmission circuit according to claim 11, wherein said third control signal is generated based on a signal outputted from said driver circuit.

15. A transmission circuit according to claim 11, wherein said third control signal is based on the first control signal.

16. A transmission circuit according to claim 11, wherein said third control signal is based on the second control signal.

17. A transmission circuit comprising:

a plurality of signal lines alternately driven to a precharge period and an evaluation period by their corresponding signal line driver circuits, said signal lines being respectively driven to a first source potential during the precharge period and driven to either the first source potential or a second source potential according to input logic levels of the driver circuits during the evaluation period; and a receiving circuit alternately controlled to the precharge period and the evaluation period according to a control signal to determine and output a combination of pieces of logic indicated by potentials on said plurality of signal lines during the evaluation period, said receiving circuit including, a first load provided between the first source potential and a first node and driven by the control signal;

a second load provided between the first source potential and a second node and driven by the control signal;

an activation circuit provided between a third node and the second source potential to drive the third node to the second source potential during the evaluation period;

a first feedback field effect transistor having a source-to-drain path inserted between the first node and a fourth node and a gate connected to the second node;

a second feedback field effect transistor having a source-to-drain path inserted between the second node and a fifth node and a gate connected to the first node;

a logic circuit comprising a plurality of input field effect transistors provided between the third node and the fourth node and having gates connected to said plurality of signal lines respectively; and at least one reference field effect transistor having a source-to-drain path provided between the third node and the fifth node and a gate connected to the first node.

18. A transmission circuit according to claim 17, wherein said plurality of input field effect transistors constituting said logic circuit are parallel-connected to one another.

19. A transmission circuit according to claim 17, wherein said plurality of input field effect transistors constituting said logic circuit are cascade-connected and said at least one reference field effect transistor comprises field effect transistors cascade-connected by the same number as that of said input field effect transistors.

20. A transmission circuit according to claim 17, wherein said logic circuit comprises a first pair of cascade-connected field effect transistors having gates to which input signals are respectively inputted, and a second pair of cascade-connected field effect transistors having gates to which complementary input signals of the input signals are respectively inputted, both pairs being connected in parallel, and said at least one reference field effect transistor comprises two cascade-connected field effect transistors and obtains an exclusive OR signal from the second node and a non-exclusive OR signal from the first node respectively.

21. A transmission circuit according to claim 17, wherein said logic circuit comprises a first pair of cascade-connected field effect transistors having gates to which an input signal and a complementary input signal thereof are applied, and a second pair of cascade-connected field effect transistors having gates to which another input signal and a complementary input signal thereof are applied, both pairs being connected in parallel and cascade-connected intermediate points of said first and second pairs of field effect transistors being connected to one another, and said at least one reference field effect transistor comprises two cascade-connected field effect transistors and obtains an exclusive OR signal from the second node and a non-exclusive OR signal from the first node.

22. A transmission circuit according to claim 17, wherein said receiving circuit has a selector for supplying an input signal to an input terminal of said logic circuit, and said selector is controlled to a selected state and a non-selected state according to a select signal, and outputs a signal based on the input signal thereof upon the selected state and holds the signal outputted therefrom at the second source potential upon the non-selected state.

23. A transmission circuit comprising:

driver circuits each alternately controlled to a precharge period and an evaluation period according to a first control signal so as to drive a pair of output nodes respectively, said driver circuit driving the pair of output nodes to a first source potential together during the precharge period and complementarily driving one of the pair of output nodes to a second source potential and the other thereof to the first source potential, based on respective potentials at complementary input nodes during the evaluation period;

first and second signal lines respectively coupled to the pair of output nodes of said driver circuit and thereby driven by the first and second driver circuits; and a receiving circuit having a first node and a second node, said receiving circuit being alternately controlled to the precharge period and the evaluation period according to a second control signal to precharge the first and second nodes to the first source potential together during the precharge period, and discharge the first node according to a potential on the first signal line and discharge the second node according to a potential on said second signal line during the evaluation period, thereby discriminating between high and low levels of mutual potentials on said first and second signal lines during the evaluation period.

24. A transmission circuit according to claim 1, wherein said receiving circuit comprises a semiconductor logic circuit.

25. A transmission circuit according to claim 9, wherein said receiving circuit comprises a semiconductor logic circuit.

26. A transmission circuit according to claim 10, wherein said receiving circuit comprises a semiconductor logic circuit.

27. A transmission circuit according to claim 11, wherein said receiving circuit comprises a semiconductor logic circuit.

28. A transmission circuit comprising:

a driver circuit alternately controlled to a precharge period and an evaluation period according to a first control signal, said driver circuit precharging an output node to a first source potential during the precharge period and driving the output node to either one of the first source potential and a second source potential according to a potential at an input node during the evaluation period;

a signal line coupled to the output node of said driver circuit so as to be driven by said driver circuit; and a receiving circuit coupled to said signal line and alternately controlled to the precharge period and the evaluation period according to a second control signal, wherein said receiving circuit includes:

a single receiving node connected to said signal line, a first complementary output node driven to a first potential reflecting a potential of said receiving node during the evaluation period, a second complementary output node driven to a second potential reflecting the potential of said receiving node and forming a complementary output with a potential of said first complementary output node during the evaluation period, a precharge circuit precharging said first and second complementary output nodes to said first source potential during the precharge period, a first active circuit device discharging said second complementary output node controlled by the potential of said first complementary output node during the evaluation period, and a second active circuit device discharging said first complementary output node controlled by the potential of said receiving node during the evaluation period.

\* \* \* \* \*